US010397501B2

(12) United States Patent
Suzuki

(10) Patent No.: US 10,397,501 B2
(45) Date of Patent: Aug. 27, 2019

(54) SOLID-STATE IMAGE SENSOR AND IMAGING APPARATUS

(71) Applicant: Atsushi Suzuki, Hyogo (JP)

(72) Inventor: Atsushi Suzuki, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/907,440

(22) Filed: Feb. 28, 2018

(65) Prior Publication Data

US 2018/0255253 A1 Sep. 6, 2018

(30) Foreign Application Priority Data

Mar. 3, 2017 (JP) ................................ 2017-040785

(51) Int. Cl.

*H04N 5/355* (2011.01)
*H04N 5/374* (2011.01)
*H04N 5/378* (2011.01)
*H04N 5/353* (2011.01)
*H01L 27/146* (2006.01)
*H04N 5/3745* (2011.01)

(52) U.S. Cl.

CPC ......... *H04N 5/3559* (2013.01); *H01L 27/146* (2013.01); *H04N 5/3532* (2013.01); *H04N 5/378* (2013.01); *H04N 5/3742* (2013.01); *H04N 5/3745* (2013.01)

(58) Field of Classification Search

CPC .. H04N 5/3559; H04N 5/1745; H04N 5/3532; H04N 5/2742; H04N 5/3745; H04N 5/378; H01L 37/00; H01L 27/146

USPC .............. 348/308, 301, 300, 302, 304, 307; 257/291, 292, 258, 390, 443; 250/208.1

See application file for complete search history.

(56) References Cited

U.S. PATENT DOCUMENTS

2010/0259662 A1* 10/2010 Oike ..................... H04N 5/335 348/308
2015/0029375 A1* 1/2015 Sugawa ................ H04N 5/363 348/308

(Continued)

FOREIGN PATENT DOCUMENTS

JP 2008-099158 4/2008
JP 2010-245955 10/2010

(Continued)

*Primary Examiner* — Marly S Camargo
(74) *Attorney, Agent, or Firm* — Oblon, McClelland, Maier & Neustadt, L.L.P.

(57) ABSTRACT

A solid-state image sensor includes a pixel array including a plurality of pixel sub-arrays arranged in a main scanning direction, each of the pixel sub-arrays having a plurality of pixels two-dimensionally arranged to form a plurality of rows along the main scanning direction and a plurality of columns along the sub-scanning direction. The solid-state image sensor further includes control lines, signal lines, a pixel control circuit, and a read out circuit. The pixel control circuit applies a control signal to each pixel of each of the plurality of pixel sub-arrays through each of the plurality of signal lines, to cause each pixel to generate a pixel signal having a phase difference between the plurality of pixel sub-arrays. The readout circuit reads the pixel signal from each pixel of each of the plurality of pixel sub-arrays such that the pixel signal has a phase difference between the plurality of pixel sub-arrays.

10 Claims, 10 Drawing Sheets

(56) References Cited

U.S. PATENT DOCUMENTS

| | | | | |
|---|---|---|---|---|
| 2016/0141326 A1* | 5/2016 | Hanzawa | H01L 27/146 | 250/208.1 |
| 2016/0249004 A1* | 8/2016 | Saeli | H04N 5/37455 | 348/308 |
| 2017/0244919 A1 | 8/2017 | Suzuki | | |
| 2017/0256575 A1 | 9/2017 | Suzuki | | |
| 2017/0272742 A1 | 9/2017 | Suzuki et al. | | |
| 2019/0082133 A1* | 3/2019 | Shikina | H04N 5/378 | 348/241 |

FOREIGN PATENT DOCUMENTS

| | | |
|---|---|---|
| JP | 2014-230099 | 12/2014 |
| JP | 2015-106908 | 6/2015 |
| JP | 2015-115637 | 6/2015 |
| WO | WO2009/031303 A1 | 3/2009 |

* cited by examiner

SOLID-STATE IMAGE SENSOR AND IMAGING APPARATUS

CROSS-REFERENCE TO RELATED APPLICATION

This patent application is based on and claims priority pursuant to 35 U.S.C. § 119(a) to Japanese Patent Application No. 2017-040785, filed on Mar. 3, 2017 in the Japan Patent Office, the entire disclosure of which is hereby incorporated by reference herein.

BACKGROUND

Technical Field

The embodiments of the present disclosure relate to a solid-state image sensor and an imaging apparatus.

Background Art

A solid-state image sensor such as a complementary metal oxide semiconductor (CMOS) image sensor includes a pixel array including a plurality of pixels arranged in an array in a main scanning direction and a sub-scanning direction. The solid-state image sensor further includes a readout circuit disposed at the periphery of the pixel array. The readout circuit reads pixel signals from each pixel of the pixel array via signal lines. Each pixel of the pixel array includes a photoelectric conversion element such as a photodiode, a floating diffusion that converts charges generated by photoelectric conversion into a voltage, a charge transfer transistor, a reset transistor, and an amplification transistor. The reading circuit includes, for example, an analog amplifier and an analog-to-digital converter (ADC). In general, the readout circuit simultaneously reads pixel signals from a plurality of pixels arranged in the main scanning direction, so that a plurality of circuits corresponding to these pixels is provided in the solid-state image sensor.

SUMMARY

In one aspect of this disclosure, there is provided an improved solid-state image sensor including a pixel array including a plurality of pixel sub-arrays arranged in a main scanning direction, each of the pixel sub-arrays having a plurality of pixels that are two-dimensionally arranged to form a plurality of rows along the main scanning direction and a plurality of columns along a sub-scanning direction. Each of the plurality of pixels generates a pixel signal according to light being input. The solid-state image sensor further includes a plurality of control lines connected with respective ones of the plurality of pixel sub-arrays such that one of the plurality of control lines is connected with all pixels of at least one of the plurality of rows in each of the plurality of pixel sub-arrays. The solid-state image sensor still further includes a plurality of signal lines individually connected with all pixels in each of the plurality of pixel sub-arrays and a pixel control circuit. The pixel control circuit applies a control signal to each pixel of each of the plurality of pixel sub-arrays through each of the plurality of signal lines, so as to cause each pixel to generate a pixel signal having a phase difference between the plurality of pixel sub-arrays. The solid-state image sensor even further includes a readout circuit to read the pixel signal from each pixel of each of the plurality of pixel sub-arrays such that the pixel signal has a phase difference between the plurality of pixel sub-arrays.

In still another aspect of this disclosure there is provided an improved imaging apparatus including the above-described solid-state image sensor; an optical system, an image processing circuit, and a drive device. The optical system guides light being input to the imaging apparatus, to each pixel of the solid-state image sensor. The image processing circuit processes an output signal of the solid-state image sensor. The drive device moves the solid-state image sensor at a predetermined speed in the sub-scanning direction, relative to an object.

BRIEF DESCRIPTION OF THE DRAWINGS

The aforementioned and other aspects, features, and advantages of the present disclosure will be better understood by reference to the following detailed description when considered in connection with the accompanying drawings, wherein.

Figure 1:
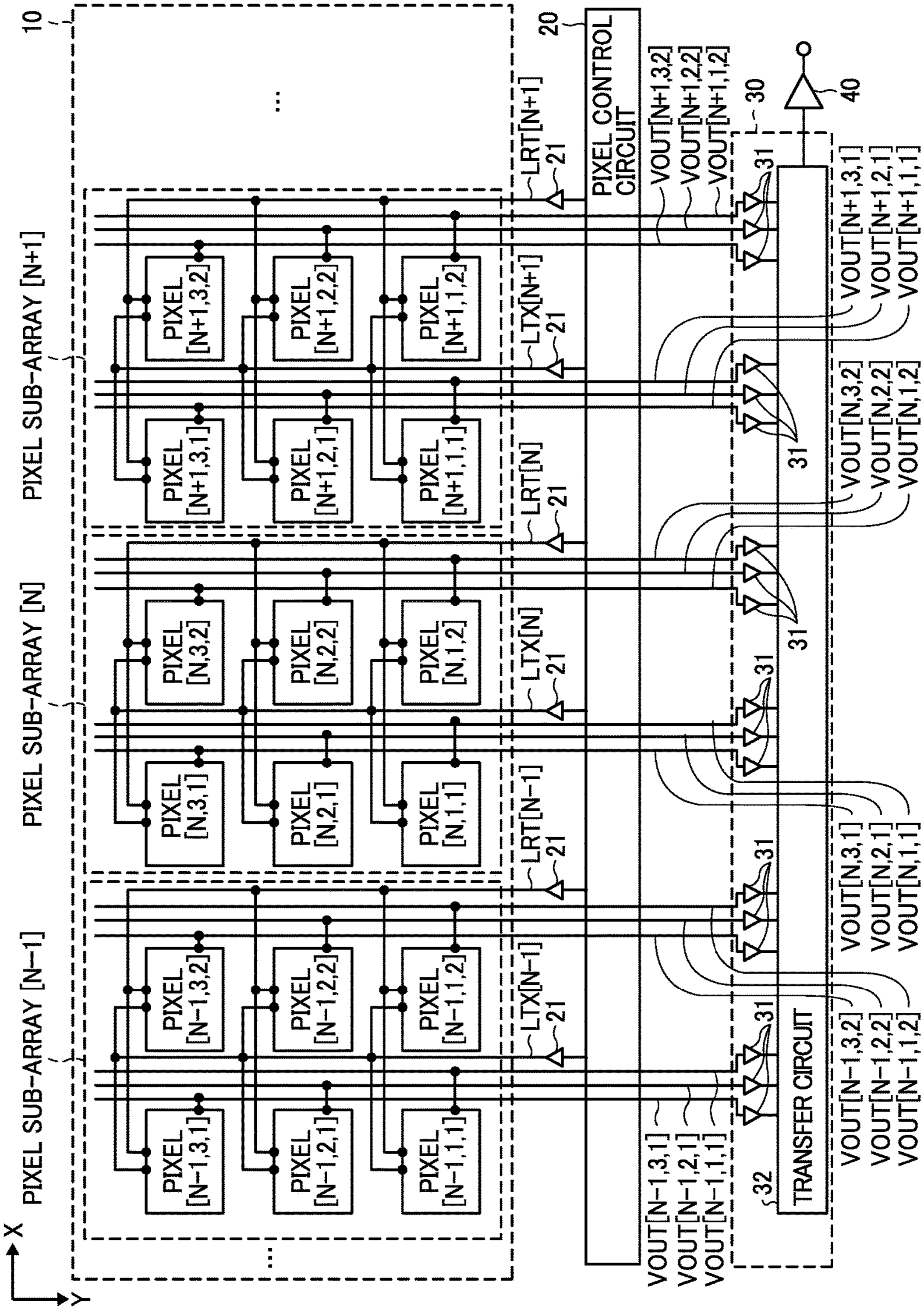
FIG. 1 is a block diagram of the overall configuration of a solid-state image sensor according to a first embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable.

Embodiments of the present disclosure will be described in detail with reference to the following figures.

First Embodiment

FIG. 1 is a block diagram of the overall configuration of a solid-state image sensor according to a first embodiment of the present disclosure. The image solid-state image sensor 2 in FIG. 1 includes a pixel array 10, a pixel control circuit 20, a readout circuit 30, an amplifier 40, a plurality of control lines LTX [a], LRT [a], and a plurality of signal lines VOUT [a, b, c]. These constituent elements of the solid-state image sensor are formed on, for example, a semiconductor substrate.

The pixel array 10 includes a plurality of pixels [a, b, c] that respectively generate pixel signals according to incident light, and the pixels [a, b, c] are two-dimensionally arranged in the main scanning direction (Z direction in FIG. 1) and the sub-scanning direction (Y direction in FIG. 1). The pixel array 10 includes a plurality of pixel sub-arrays [a] arranged in the main scanning direction. Each pixel sub-array [a] includes a plurality of pixels [a, b, c], two-dimensionally arranged to form a plurality of rows (three rows in FIG. 1) along the main scanning direction and a plurality of columns (two columns in FIG. 1) along the sub-scanning direction. In the present embodiment, the symbol "a" denotes a number of the pixel sub-array (N−1, N, N+1 in FIG. 1), the symbol "b" denotes a number of the row (1 to 3 in FIG. 1), and the symbol "c" denotes a number of the column in each pixel sub-array (1 to 2 in FIG. 1).

Each pixel [a, b, c] has, for example, a square shape and has the same size as each other. In each of the pixel sub-arrays [a], the plurality of pixels [a, b, c] are arranged at, e.g., equal intervals, for example, in the main scanning direction, and are arranged at, e.g., equal intervals in the sub-scanning direction.

Different color components (blue, green, red, etc.) of light from an object are incident on the pixels [a, b, c] of different rows by, e.g., a filter.

The plurality of control lines LTX [a] and LRT [a] are connected with each pixel [a, b, c] in each pixel sub-array [a]. Each of the control lines LTX [a] and LRT [a] is a linear conductor. In each pixel sub-array [a], all the pixels [a, b, c] of at least one row in the same pixel sub-array [a] are connected with one control line LTX [a] and one control line LRT [a]. In FIG. 1, in each pixel sub-array [a], the control line LTX [a] is connected with all the pixels [a, b, c] of each row in the same pixel sub-array [a]. Further, in each pixel sub-array [a], the control line LRT [a] is connected with all the pixels [a, b, c] of each row in the same pixel sub-array [a].

In each pixel sub-array [a], the plurality of pixels [a, b, c] is arranged to form a plurality of columns (two columns in FIG. 1) that is greater than or equal to the sum of each of the control lines LTX [a, b] and LRT [a, b]).

The plurality of signal lines VOUT [a, b, c] are individually connected with each pixel [a, b, c] in each one pixel sub-array [a]. Each signal line VOUT [a, b, c] is a linear conductor.

The pixel control circuit 20 applies a control signal to each pixel [a, b, c] of each pixel sub-array [a] via each of the control lines LTX [a] and LRT [a]. As a result, the pixel control circuit 20 causes each pixel [a, b, c] of each pixel sub-array [a] to generate a pixel signal (an analog signal) such that each pixel signal has a phase difference between the plurality of pixel sub-arrays [a]. In each of the control lines LTX [a] and LRT [a], an amplifier 21 is provided between the pixel control circuit 20 and each pixel [a, b, c].

The readout circuit 30 includes a plurality of amplifiers 31 and a transfer circuit 32. The readout circuit 30 reads a pixel signal of each pixel [a, b, c] of each pixel sub-array [a] through the corresponding signal line VOUT [a, b, c] such that each pixel signal has a phase difference between the plurality of pixel sub-arrays [a]. In each signal line VOUT [a, b, c], each of the plurality of amplifiers 31 is provided between each pixel [a, b, c] and the transfer circuit 32 to amplify the pixel signal read from each pixel [a, b, c] in an analog manner. The transfer circuit 32 converts the pixel signal read from each pixel [a, b, c], having a phase difference between the plurality of pixel sub-array [a] to a serial signal, and transfers the serial signal to the amplifier 40 in an analog manner.

The amplifier 40 amplifies the signal input from the readout circuit 30. In some embodiments, an additional analog signal processing circuit is disposed after the amplifier 40 to interface with the outside of the solid-state image sensor. Alternatively, in some other embodiments, an analog-to-digital conversion circuit and a digital signal processing circuit are provided after the amplifier 40 for such an interface.

In the case of FIG. 1, the pixel array 10, the pixel control circuit 20, and the readout circuit 30 are arranged in the sub-scanning direction. Each of the control lines LTX [a] and LRT [a], and signal lines VOUT [a, b, c] includes a section (conductor section) arranged along the sub-scanning direction.

Figure 2:
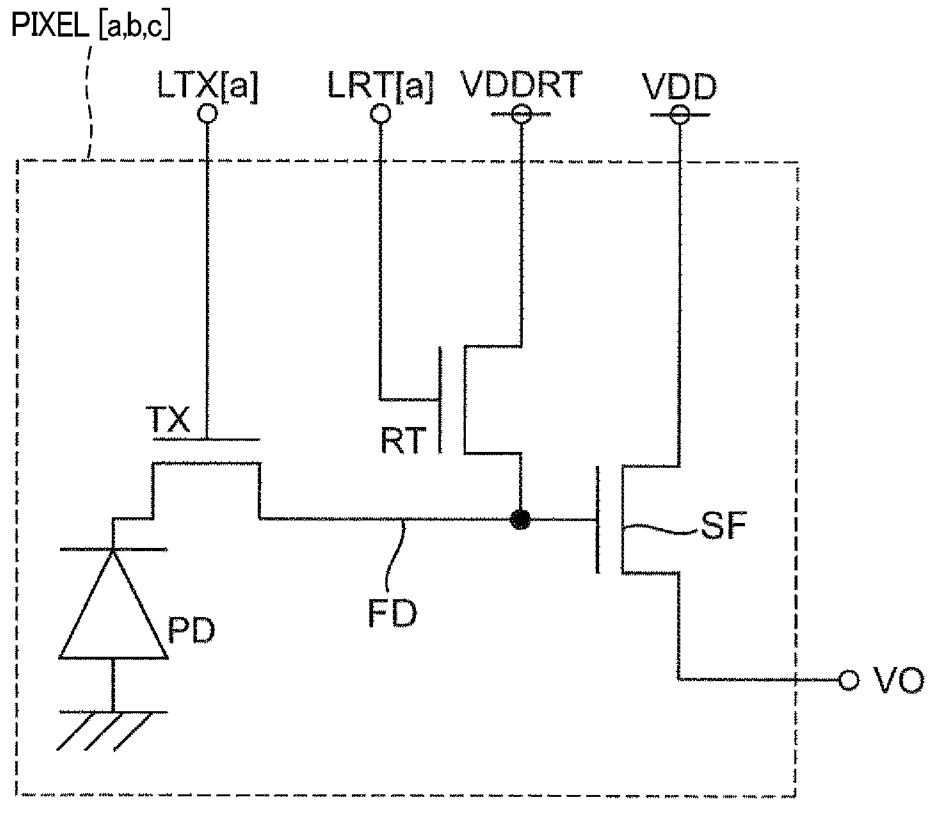
FIG. 2 is a circuit diagram of a detailed configuration of a pixel [a, b, c] in the solid-state image sensor FIG. 1.

FIG. 2 is a circuit diagram of the detailed configuration of the pixel [a, b, c] of FIG. 1. Each pixel [a, b, c] includes a photoelectric conversion element PD, a transfer transistor TX, a floating diffusion FD, a reset transistor RT, and an amplifier transistor SF.

The photoelectric conversion element PD converts incident light to each pixel into electric charge. The photoelectric conversion element PD is, for example, a photodiode.

The transfer transistor TX is connected between the photoelectric conversion element PD and the floating diffusion FD. The control signal from the pixel control circuit 20 is applied to a gate terminal of the transfer transistor TX through the control line LTX [a]. The transfer transistor TX transfers charges from the photoelectric conversion element PD to the floating diffusion FD according to the control signal applied via the control line LTX [a].

The floating diffusion FD is a region on the semiconductor substrate, to temporarily accumulate charges transferred from the photoelectric conversion element PD.

The reset transistor RT is connected between the reset power supply VDDRT and the floating diffusion FD. The control signal is applied from the pixel control circuit 20 to a gate terminal of the reset transistor RT through the control line LRT [a]. The reset transistor RT resets the potential of the floating diffusion FD to the potential of the reset power supply VDDRT according to the control signal applied through the control line LRT [a].

The drain of the amplification transistor SF is connected to the power supply VDD, and the source of the amplification transistor SF is connected to the terminal VO. The terminal VO is connected to the signal line VOUT [a, b, c]. The gate of the amplification transistor SF is connected to the floating diffusion FD. The amplification transistor SF forms a source follower with a constant current source outside the pixel array 10. The amplification transistor SF amplifies the voltage at the floating diffusion FD and generates a pixel signal having the amplified voltage.

Figure 3:
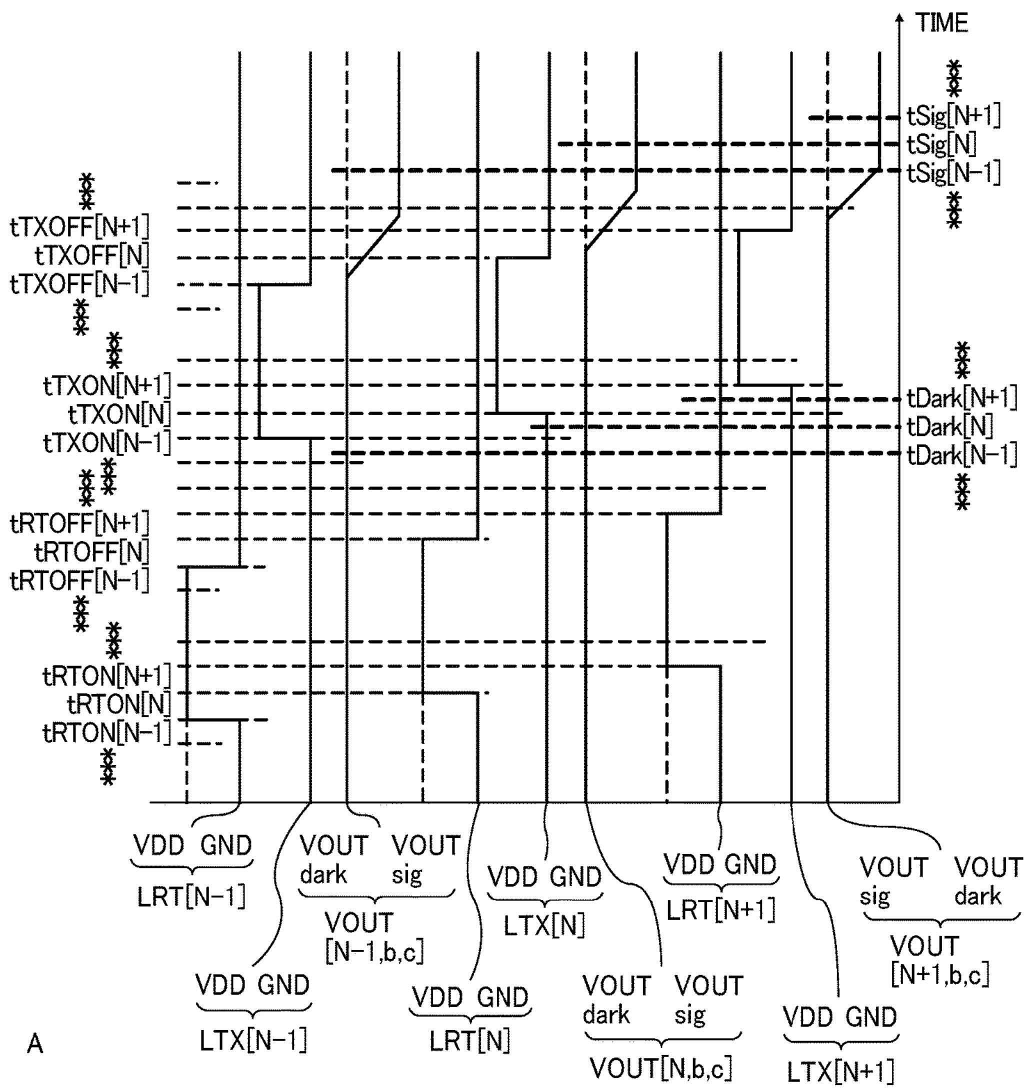
FIG. 3 is a timing chart of an operation of each pixel of the pixel sub-array [N−1], [N], and [N+1] in FIG. 1.

FIG. 3 is a timing chart of an operation of each pixel of the pixel sub arrays [N−1], [N], and [N+1] in FIG. 1.

Each of the control lines LRT [a] and LTX [a] transmits a signal having a high-level potential VDD and a low-level potential GND. The pixel signal in the signal line VOUT [a, b, c] includes a reset signal VOUTdark indicating a potential at the time of resetting the potential of the floating diffusion FD and an exposure signal VOUTsig indicating the potential at the time of generating electric charges according to the incident light.

The following initially describes the readout of the reset signal VOUTdark from each pixel [a, b, c] of each pixel sub-array [a]. At the time tRTON [a], the pixel control circuit 20 shifts the potential of the control line LRT [a] from the low level to the high level, thereby resetting the potential of the floating diffusion FD of each pixel [a, b, c] to the potential of the power source VDDRT. Subsequently, at the time tRTOFF [a], the pixel control circuit 20 shifts the potential of the control line LRT [a] from the high level to the low level, thereby disconnecting the floating diffusion FD of each pixel [a, b, c] from the power source VDDRT. Thereafter, at time tDark [a], the readout circuit 30 reads the reset signal VOUTdark from the pixel [a, b, c] via the signal line VOUT [a, b, c] (sampling operation).

The photoelectric conversion element PD of each pixel [a, b, c] generates charges according to the incident light.

Next, a description is given of the readout of the exposure signal VOUTsig from each pixel [a, b, c] of each pixel sub-array [a]. At time tTXON [a], the pixel control circuit 20 shifts the potential of the control line LTX [a] from the low level to the high level, thereby transferring the electric charges generated according to the incident light in the photoelectric conversion element PD to the floating diffusion FD. Subsequently, at the time tTXOFF [a], the pixel control circuit 20 shifts the potential of the control line LTX [a] from the high level to the low level, thereby disconnecting the floating diffusion FD of each pixel [a, b, c] from the photoelectric conversion element PD. Thereafter, at time tSig [a], the readout circuit 30 reads the exposure signal VOUTsig from the pixel [a, b, c] via the signal line VOUT [a, b, c] (sampling operation).

As described above, the pixel control circuit 20 thereby causes each pixel [a, b, c] of each pixel sub-array [a] to operate and generate a pixel signal such that each pixel signal has a phase difference between the plurality of pixel sub-arrays [a]. Further, the readout circuit 30 reads a pixel signal of each pixel [a, b, c] of each pixel sub-array [a] through the corresponding signal line VOUT [a, b, c] such that each pixel signal has a phase difference between the plurality of pixel sub-arrays [a]. Hereinafter, referring to FIG. 3, a description is given of the generation and readout of a pixel signal having a phase difference between the plurality of pixel sub-arrays [a].

By setting the control signal in the control line LRT [N−1] to a high level over times tRTON [N−1] to tRTOFF [N−1], the reset transistor RT resets the potential of the floating diffusion FD of the pixel [N−1, b, c] of the pixel sub-array [N−1]. By setting the control signal in the control line LRT [N] to a high level over times tRTON [N] to tRTOFF [N], the reset transistor RT resets the potential of the floating diffusion FD of the pixel [N, b, c] of the pixel sub-array [N]. By setting the control signal in the control line LRT [N+1] to a high level over times tRTON [N+1] to tRTOFF [N+1], the reset transistor RT resets the potential of the floating diffusion FD of the pixel [N+1, b, c] of the pixel sub-array [N+1].

At the time tDark [N−1], the readout circuit 30 reads out the reset signal VOUTdark of the pixel [N−1, b, c] of the pixel sub-array [N−1]. At the time tDark [N], the readout circuit 30 reads out the reset signal VOUTdark of the pixel [N, b, c] of the pixel sub-array [N]. At the time tDark [N+1], the readout circuit 30 reads out the reset signal VOUTdark of the pixel [N+1, b, c] of the pixel sub-array [N+1].

By setting the control signal in the control line LTX [N−1] to a high level over times tTXON [N−1] to tTXOFF [N−1], the transfer transistor TX transfers charges from the photoelectric conversion element PD to the floating diffusion FD in the pixel [N−1, b, c] of the pixel sub-array [N−1]. By setting the control signal in the control line LTX [N] to a high level over times tTXON [N] to tTXOFF [N], the transfer transistor TX transfers charges from the photoelectric conversion element PD to the floating diffusion FD in the pixel [N, b, c] of the pixel sub-array [N]. By setting the control signal in the control line LTX [N+1] to a high level over times tTXON [+1] to tTXOFF [N+1], the transfer transistor TX transfers charges from the photoelectric conversion element PD to the floating diffusion FD in the pixel [N+1, b, c] of the pixel sub-array [N+1].

At the time tSig [N−1], the readout circuit 30 reads out the exposure signal VOUTsig of the pixel [N−1, b, c] of the pixel sub-array [N−1]. At the time tSig [N], the readout circuit 30 reads out the exposure signal VOUTsig of the pixel [N, b, c] of the pixel sub-array [N]. At the time tSig [N+1], the readout circuit 30 reads out the exposure signal VOUTsig of the pixel [N+1, b, c] of the pixel sub-array [+1N].

The readout circuit 30 is configured to read out the pixel signal from each pixel [a, b, c] of each pixel sub-array [a] through the corresponding signal line VOUT [a, b, c] at the timing other than the rising timing and the falling timing of each signal in the control lines LTX [a] and LRT [a]. In other words, the timings of the operations of each pixel [a, b, c], i.e., the times tDark [a] and tSig [a] are different from any of the times tRTON [a], tRTOFF [a], tTXON [a], and tTXOFF [a]. When these times tDark [a] and tSig [a] coincide with any of the times tRTON [a], tRTOFF [a], tTXON [a], and tTXOFF [a], the potentials of the power supply and the substrate fluctuate due to the voltage fluctuation of the control lines of the adjacent pixel sub-arrays, thereby further fluctuating the signal of the pixel sub-array from which the pixel signal is to be read, resulting in deterioration of image quality. The operation according to FIG. 3 allows preventing the fluctuations in such potentials and the image quality deterioration.

The solid-state image sensor 2 according to the first embodiment advantageously reduces the scale of the readout circuit 30 for reading image signals.

The solid-state image sensor 2 in FIG. 1 generates and reads pixel signals having phase differences between the plurality of pixel sub-arrays [a]. This configuration allows any circuit after the readout circuit 30 to be used in common among the plurality of of pixel sub-arrays [a]. Accordingly, such a configuration significantly reduces the number of circuit components, thus providing a solid-state image sensor with reduced chip size, as compared to the case in which a circuit is provided for each column of the pixel array 10.

Second Embodiment

Figure 4:
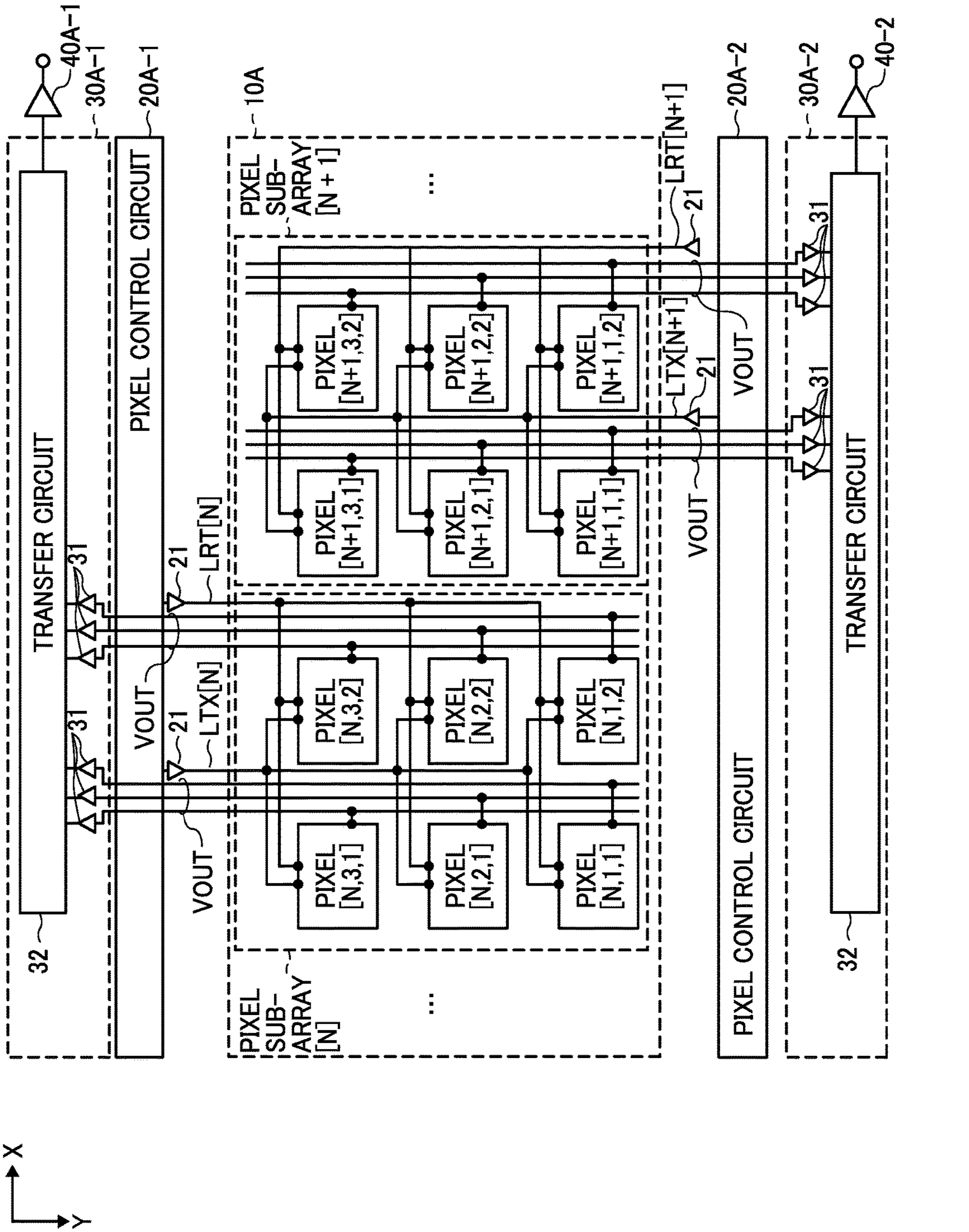
FIG. 4 is a block diagram of the overall configuration of a solid-state image sensor according to a second embodiment of the present disclosure.

FIG. 4 is a block diagram of the overall configuration of the solid-state image sensor 2 according to a second embodiment of the present disclosure. The solid-state image sensor 2 of FIG. 1 (the first embodiment) includes one pixel control circuit 20, one readout circuit 30, and one amplifier 40. By contrast, the solid-state image sensor of FIG. 4 (the second embodiment) includes two pixel control circuits 20A-1 and 20A-2, two readout circuits 30A-1 and 30A-2, and two amplifiers 40-1 and 40-2. In addition, the solid-state image sensor 2 of FIG. 4 includes a pixel array 10A instead of the pixel array 10 of FIG. 1. In FIG. 4 and the following figures, the signal lines are collectively indicated by the symbol "VOUT" for simplicity of illustration.

The pixel control circuits 20A-1 and the pixel control circuit 20A-2 are disposed on opposite sides of the pixel array 10A. In the present disclosure, the pixel control circuit 20A-1 and the pixel control circuit 20A-2 are also referred to as "a first pixel control circuit and a second pixel control circuit". The readout circuit 30A-1 and the readout circuit 30A-2 are also disposed on opposite sides of the pixel array 10A. In the present disclosure, the readout circuit 30A-1 and the readout circuit 30A-2 are also referred to as "a first readout circuit and a second readout circuit". In the pixel array 10A, each pixel sub-array [a] is connected to one of the pixel control circuit 20A-1 and the pixel control circuit 20A-2 and is also connected to one of the readout circuits 30A-1 and 30A-2.

Same as in the first embodiment of FIG. 1, the solid-state image sensor 2 of FIG. 4 generates and reads pixel signals having phase differences between a plurality of pixel sub-arrays [a]. With this configuration, a circuit at the stage subsequent to the readout circuit 30A-1 is commonly used between a plurality of pixel sub-arrays [a] connected to the readout circuit 30A-1. Further, a circuit at a stage subsequent to the readout circuit 30A-2 is commonly used between a plurality of pixel sub-arrays [a] connected to the circuit 30A-2. Accordingly, such a configuration significantly reduces the number of circuit components, thus providing a solid-state image sensor with reduced chip size, as compared to the case in which a circuit is provided for each column of the pixel array 10A.

Third Embodiment

Figure 5:
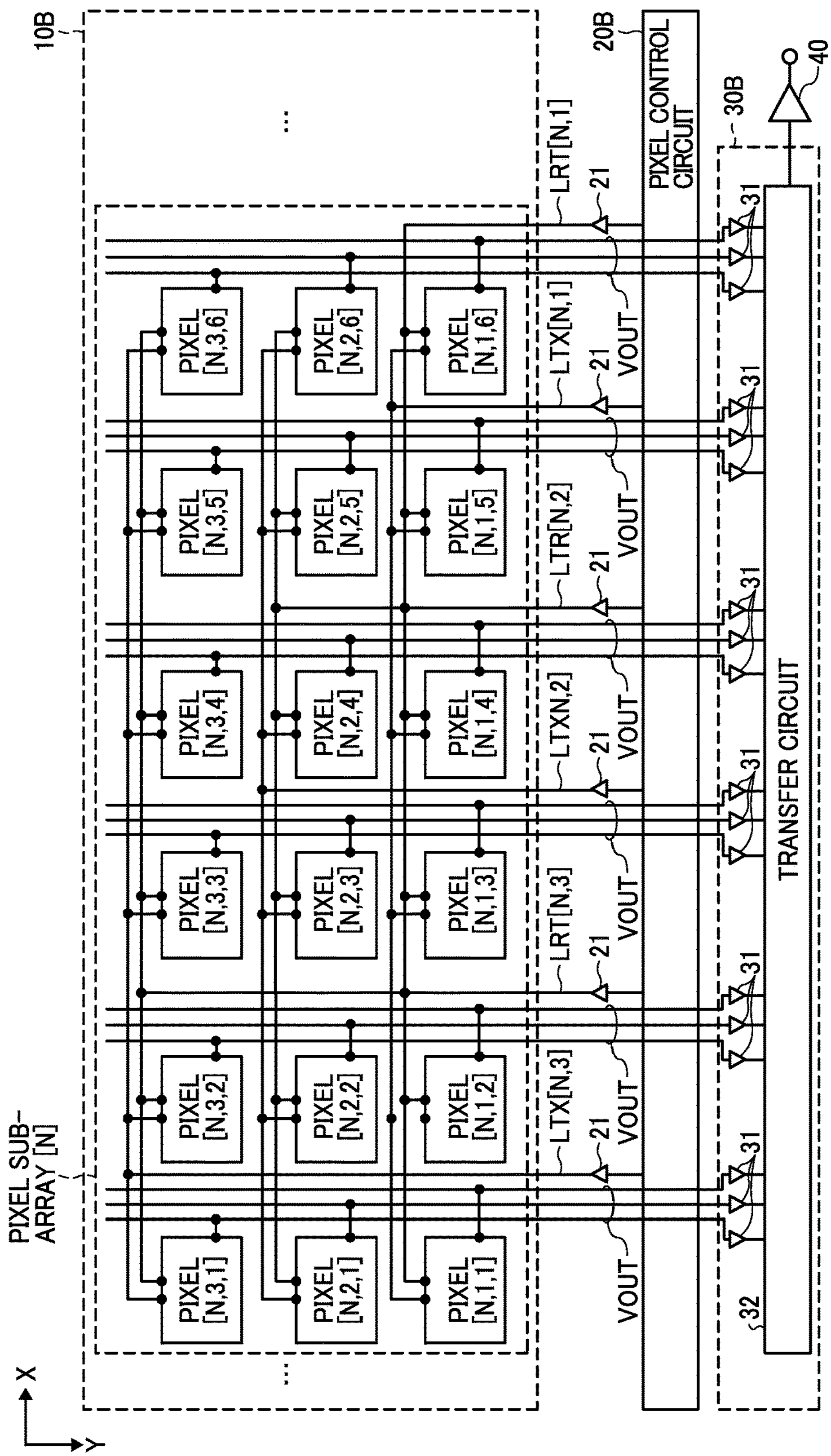
FIG. 5 is a block diagram of the overall configuration of a solid-state image sensor according to a third embodiment of the present disclosure.

FIG. 5 is a block diagram of the overall configuration of the solid-state image sensor 2 according to a third embodiment of the present disclosure. The image solid-state image sensor 2 in FIG. 5 includes a pixel array 10B, a pixel control circuit 20B, a readout circuit 30B, an amplifier 40, a plurality of control lines LTX [a, b], LRT [a, b], and a plurality of signal lines VOUT [a, b, c].

In the solid-state image sensor of FIG. 5, each of the control lines LTX [a, b] and LRT [a, b] is connected with all pixels [a, b, c] of one row [b] in each pixel sub-array [a]. Accordingly, the configuration according to the third embodiment allows independently controlling pixels [a, b, c] for each row through the control lines LTX [a, b] and LRT [a, b] in the pixel array 10B.

In each pixel sub-array [a], the plurality of pixels [a, b, c] are arranged to form a plurality of columns (six columns in FIG. 5) that is greater than or equal to the sum of each of the control lines LTX [a, b] and LRT [a, b]).

In the solid-state image sensor 2 of FIG. 5, pixels [a, b, c] are independently controllable for each row in the pixel array 10B. As illustrated in FIG. 5 for example, there is a case in which the pixel array 10B includes three rows and light having a different transmittance enters the pixels for each row by using color filters of blue, green, and red. With a change in time period of shifting the control lines LTX [a, b] and LRT [a, b] to the high level for each row of the pixel array 10B, the exposure time for the pixels [a, b, c] for each row of the pixel array 10B is adjustable. This configuration allows the dynamic range of the pixels [a, b, c] for each row to be optimized.

Fourth Embodiment

Figure 6:
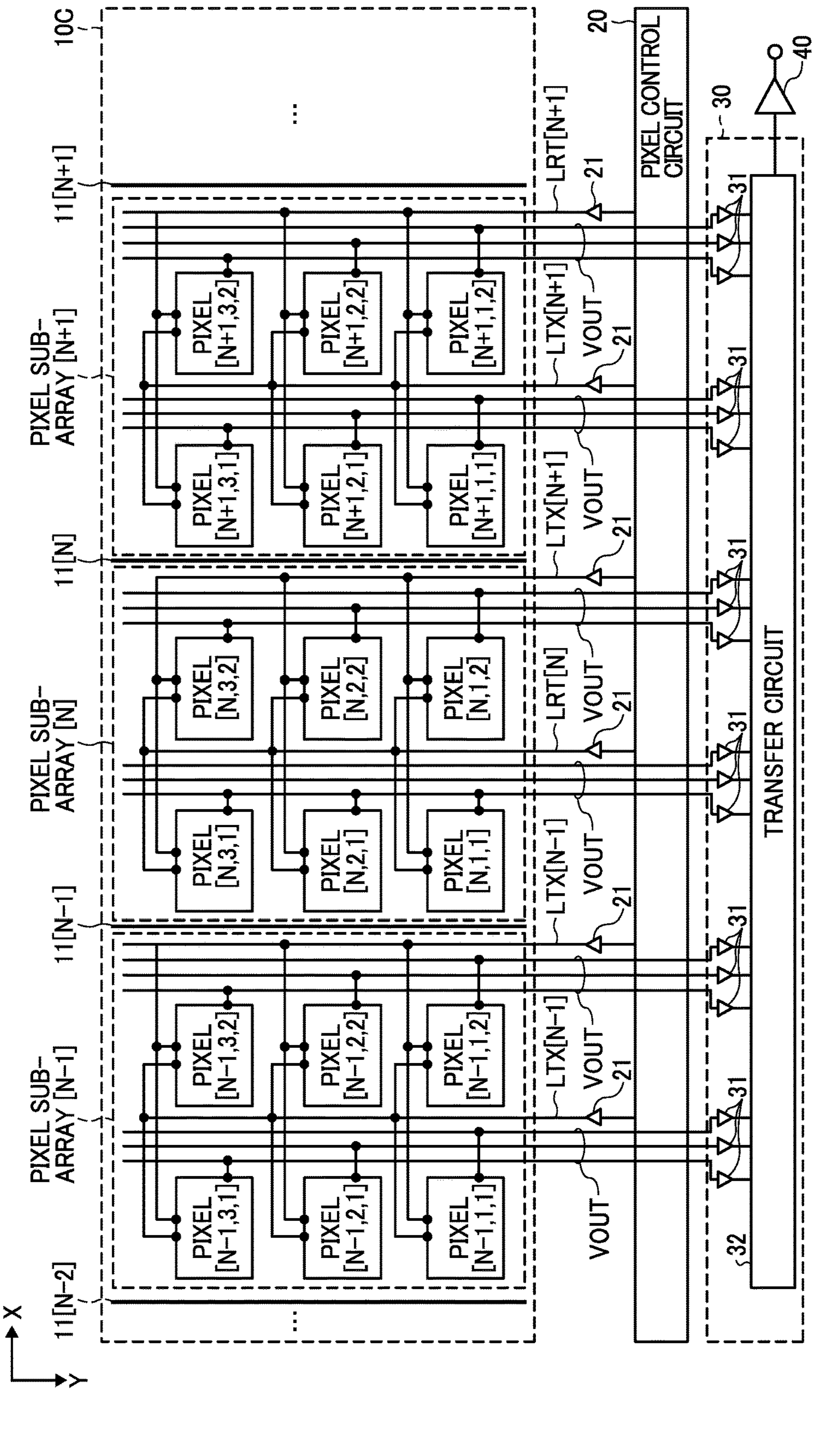
FIG. 6 is a block diagram of the overall configuration of a solid-state image sensor according to a fourth embodiment of the present disclosure.

FIG. 6 is a block diagram of the overall configuration of a solid-state image sensor 2 according to a fourth embodiment of the present disclosure. The solid-state image sensor 2 of FIG. 4 includes a pixel array 10C instead of the pixel array 10 of FIG. 1. The pixel array 10C includes a plurality of shielded conductors 11 [a], each being provided between the plurality of pixel sub-arrays [a].

In FIG. 6, the shielded conductor 11 [N−1] shields the floating diffusion FD of each pixel [N, b, c] of the pixel sub-array [N] from the control lines LRT [N−1] and LTX [N−1] of the pixel sub-array [N−1] adjacent to the pixel sub-array [N]. Further, the shielded conductor 11 [N−1] further shields the floating diffusion FD of each pixel [N−1, b, c] of the pixel sub-array [N−1] from the control lines LRT [N] and LTX [N] of the pixel sub-array [N] adjacent to the pixel sub-array [N−1]. Similarly, the shielded conductor 11 [N] shields the floating diffusion FD of each pixel [N, b, c] of the pixel sub-array [N] from the control lines LRT [N+1] and LTX [N+1] of the pixel sub-array [N+1] adjacent to the pixel sub-array [N]. Further, the shielded conductor 11 [N] further shields the floating diffusion FD of each pixel [N+1, b, c] of the pixel sub-array [N+1] from the control lines LRT [N] and LTX [N] of the pixel sub-array [N] adjacent to the pixel sub-array [N+1]. Other shielded conductors function similarly.

The potential of the floating diffusion FD of each pixel [a, b, c] of a certain pixel sub-array [a] might fluctuate with changes in parasitic capacitance between the floating diffusion FD and the control lines of the adjacent pixel sub-array. When such a potential fluctuation occurs, the image quality might deteriorate. However, the solid-state image sensor of FIG. 6 (according to the fourth embodiment) includes the shielded conductor 11 [a], which advantageously prevents the fluctuations in the potential and the deterioration of image quality.

Fifth Embodiment

Figure 7A:
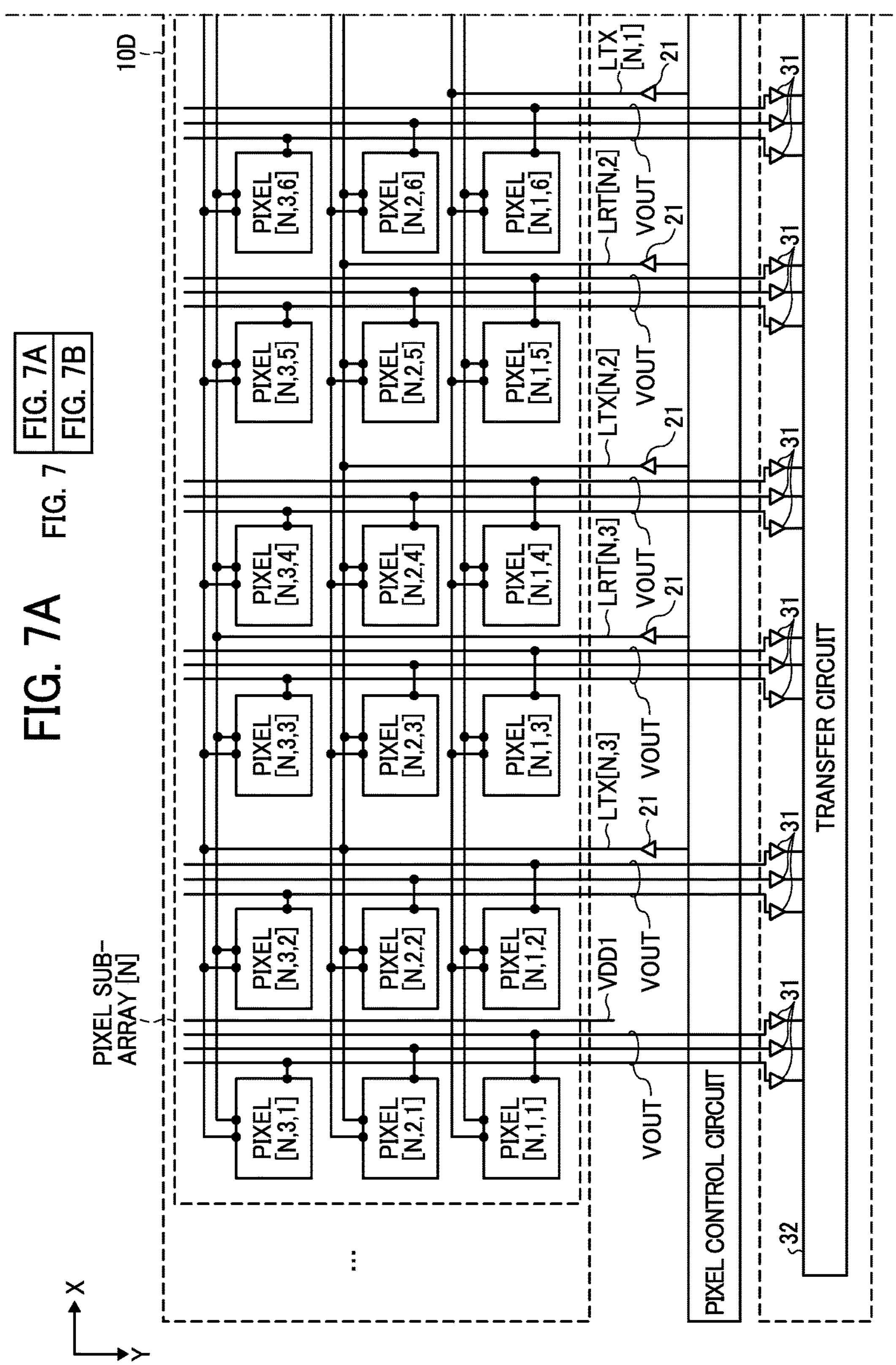
FIGS. 7A and 7B are block diagrams of the overall configuration of a solid-state image sensor according to a fifth embodiment of the present disclosure.
Figure 7B:
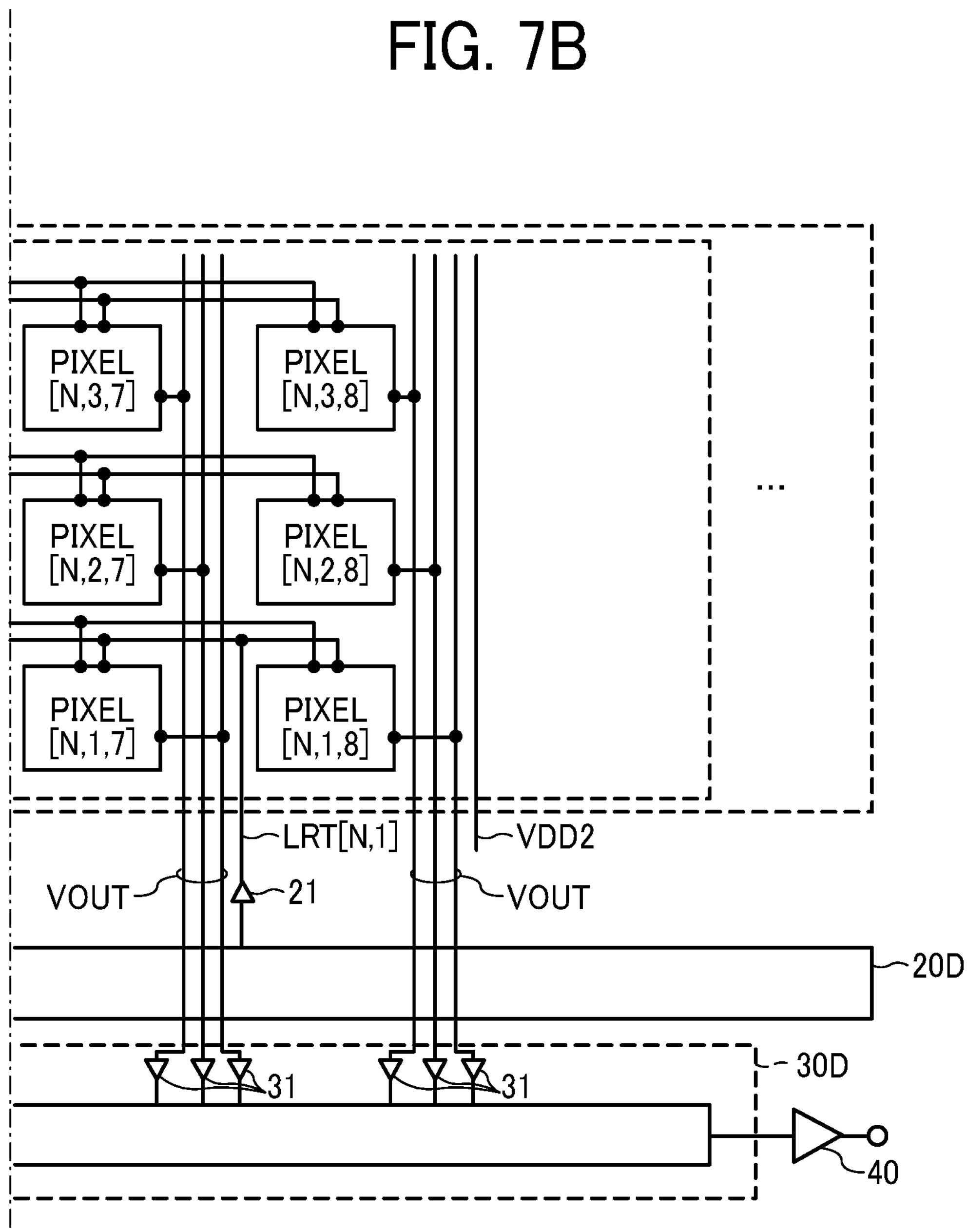

FIGS. 7A and 7B are block diagrams of the overall configuration of a solid-state image sensor according to a fifth embodiment of the present disclosure. The solid-state image sensor 2 in FIGS. 7A and 7B includes a pixel array 10D, a pixel control circuit 20D, a readout circuit 30D, an amplifier 40, a plurality of control lines LTX [a, b], LRT [a, b], a plurality of signal lines VOUT [a, b, c], and a power-source lines VDD1 and VDD2.

In the solid-state image sensor of FIGS. 7A and 7B, the control lines LTX [a] and LRT [a] are arranged along pixels [a, b, c] other than the pixels on both edges of the columns, among all the pixels of the plurality of columns in one pixel sub-array [a].

In each pixel sub-array [a], the plurality of pixels [a, b, c] are arranged to form a plurality of columns (eight columns in FIGS. 7A and 7B) that is greater than or equal to the sum of each of the control lines LTX [a, b] and LRT [a, b]).

Figure 8:
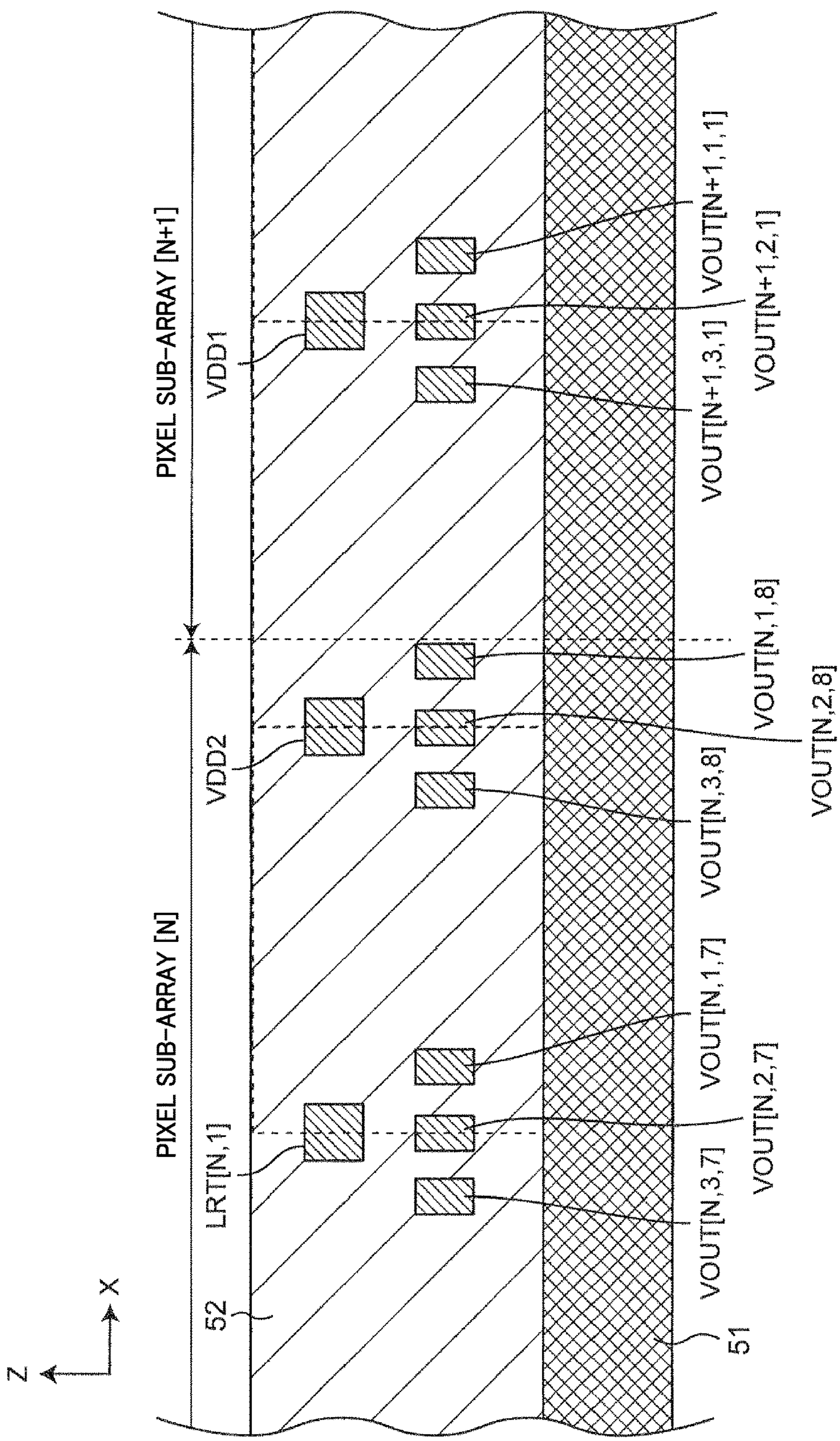
FIG. 8 is a cross-sectional view of a part of the pixel array 10D of FIGS. 7A and 7B.

FIG. 8 is a cross-sectional view of a part of the pixel array 10D of FIGS. 7A and 7B. FIG. 8 is an illustration of the vicinity of the boundary between adjacent pixel sub-arrays [N] and [N+1]. The pixel array 10D includes a semiconductor substrate 51 and an interlayer film 52 formed thereon. The control lines LRT [a, b], LTX [a, b], signal lines VOUT

[a, b, c], power supply lines VDD 1 and VDD 2 are formed in the interlayer film 52. In the vicinity of the boundary between the pixel sub-arrays [N] and [N+1], the power supply lines VDD 1 and VDD 2 or the ground line are provided, instead of the control lines.

The power-source lines VDD1 and VDD2 of FIG. 8 shield the floating diffusion FD of each pixel [N, b, c] of the pixel sub-array [N] from the control lines LRT [N+1] and LTX [N+1] of the pixel sub-array [N+1] adjacent to the pixel sub-array [N]. The power-source lines VDD1 and VDD2 of FIG. 8 shield the floating diffusion FD of each pixel [N+1, b, c] of the pixel sub-array [N+1] from the control lines LRT [N] and LTX [N] of the pixel sub-array [N] adjacent to the pixel sub-array [N+1]. The power-source lines of the other pixel sub-arrays function similarly.

Further, the configuration according to FIG. 8 (the fifth embodiment) provides a recurrent pattern of the wiring opening of the pixel, which allows uniforming the opening size. The term "opening" refers to a cylindrical area having no wiring as viewed from above of the substrate of the pixel array 10D. Referring to FIG. 8, there are areas having no wiring between the signal lines VOUT [N, 1, 7] and VOUT [N, 3, 8] and between the signal lines VOUT [N, 1, 8] and VOUT [N+1, 3, 8] in the X direction of the substrate of the pixel array 10D. In the Y direction of the substrate of the pixel array 10D as well, there is an area having no wiring. That is, there is a cylindrical area as an opening having no wiring as viewed from above of the substrate of the pixel array 10D, and light enters the pixel array 10D through the opening.

Same as the solid-state image sensor of FIG. 6 (according to the fourth embodiment), the solid-state image sensor of FIGS. 7A and 7B (according to the fifth embodiment) prevents the fluctuations in the potential of the floating diffusion FD of each pixel [a, b, c] of a certain pixel sub-array [a], and further prevents the deterioration in image quality. Further, the configuration according to the fifth embodiment equalizes the number of wires between the entire pixels, which facilitates uniforming the size of each wiring opening of a pixel.

Sixth Embodiment

Figure 9:
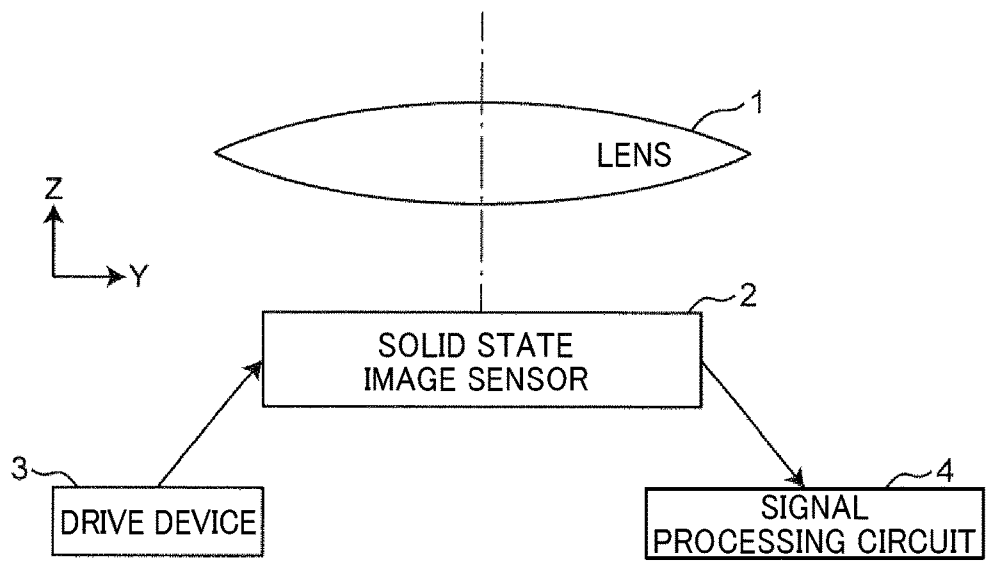
FIG. 9 is a block diagram of a configuration of an imaging apparatus according to a sixth embodiment of the present disclosure.

FIG. 9 is a block diagram of a configuration of an imaging apparatus according to Embodiment 6 of the present disclosure. The imaging apparatus in FIG. 9 includes a lens 1, a solid-state image sensor 2, a drive device 3, and a signal processing circuit 4. The imaging apparatus in FIG. 9 is, for example, a camera.

The solid-state image sensor 2 is the solid-state image sensor according to each of the first through fifth embodiments.

The lens 1 is an optical system that guides incident light to each pixel of the solid-state image sensor 2.

The drive device 3 relatively moves the solid-state image sensor 2 with respect to a subject at a predetermined speed in the sub-scanning direction. The predetermined speed may be set by default, for example, according to the specification or design of the imaging apparatus. The drive device 3 includes a timing generator that generates a timing signal for driving each circuit in the imaging apparatus, to thereby drive the imaging apparatus.

The signal processing circuit 4 processes the output signal of the solid-state image sensor 2.

In some embodiments, the output signal of the signal processing circuit 4 is recorded on a recording medium such as a memory. Image information recorded to the recording medium is copied as a hard copy using, for example, a printer. In some other embodiments, the output signal of the signal processing circuit 4 is displayed as a still image or a moving image on a monitor such as a liquid crystal display.

When the output signal of the signal processing circuit 4 is an analog signal, an analog/digital conversion circuit (AFE) is provided after the signal processing circuit 4. When the output signal of the signal processing circuit 4 is a digital signal, a digital signal processing circuit (DFE) is provided after the signal processing circuit 4.

As described above, with the solid-state image sensor according to the first through fifth embodiments mounted, a highly accurate imaging apparatus such as a camera is provided.

A solid-state image sensor and an imaging apparatus according to the embodiments of the present disclosure are provided with the following configurations.

A solid-state image sensor according to the first aspect includes a pixel array that includes a plurality of pixels being two-dimensionally arranged in a main scanning direction and a sub-scanning direction, each of the plurality of pixels to generate a pixel signal according to light being input, and a plurality of pixel sub-arrays arranged in the main scanning direction, each of the pixel sub-arrays having a plurality of pixels being two-dimensionally arranged to form a plurality of rows along the main scanning direction and a plurality of columns along the sub-scanning direction. The solid-state image sensor further includes a plurality of control lines connected with respective ones of the plurality of the pixel sub-arrays such that one of the plurality of control lines is connected with all pixels of at least one of the plurality of rows in each of the plurality of pixel sub-arrays; and a plurality of signal lines individually connected with all pixels in each of the plurality of pixel sub-arrays. The solid-state image sensor further includes a pixel control circuit to apply a control signal to each pixel of each of the plurality of pixel sub-arrays through each of the plurality of signal lines, so as to cause each pixel to generate a pixel signal having a phase difference between the plurality of pixel sub-arrays; and a readout circuit to read the pixel signal from each pixel of each of the plurality of pixel sub-arrays such that the pixel signal has a phase difference between the plurality of pixel sub-arrays.

With the solid-state image sensor according to the second aspect, each of the plurality of control lines is connected with all pixels of one row in each of the plurality of pixel sub-arrays.

With the solid-state image sensor according to the third aspect, each of the plurality of control lines is connected with all pixels of each row in each of the plurality of pixel sub-arrays.

With the solid-state image sensor according to the fourth aspect, the pixel array, the pixel control circuit, and the readout circuit are arranged in the sub-scanning direction. Each of the plurality of control lines and the plurality of signal lines is disposed along the sub-scanning direction.

With the solid-state image sensor according to the fifth aspect, the pixel control circuit includes a first pixel control circuit and a second pixel control circuit, each being disposed on an opposite side of the pixel array. The readout circuit includes a first readout circuit and a second readout circuit, each being disposed on n opposite side of the pixel array. Each of the plurality of pixel sub-arrays is connected with one of the first pixel control circuit and the second pixel control circuit, and each of the plurality of pixel sub-array is connected with one of the first readout circuit and the second readout circuit.

With the solid-state image sensor according to the sixth aspect, in each of the plurality of pixel sub-arrays, each of the plurality of control lines is disposed along pixels of a column other than columns at both ends of the plurality of columns.

With the solid-state image sensor according to the seventh aspect, each pixel includes a photoelectric conversion element to convert the light being input to a charge; a floating diffusion; a transfer transistor to transfer the charge from the photoelectric conversion element to the floating diffusion; a reset transistor to reset a potential of the floating diffusion; and an amplifier transistor to amplify a voltage in the floating diffusion to generate a pixel signal. In each of the plurality of pixel sub-arrays, the plurality of control lines includes at least one first control line connected with the transfer transistor of each pixel and at least one second control line connected with the reset transistor of each pixel.

The solid-state image sensor according to the eighth aspect further includes a plurality of shielded conductor, each being provided between the plurality of pixel sub-arrays.

With the solid-state image sensor according to the ninth aspect, the readout circuit reads the pixel signal from each pixel of each of the plurality of pixel sub-arrays through each of the plurality of signal lines, at a timing different from a rising timing and a falling timing of a signal of each of the control lines.

An imaging apparatus according to the tenth aspect includes the solid-state image sensor according to any of the first aspect through the ninth aspect; an optical system to guide light being input to the imaging apparatus, to each pixel of the solid-state image sensor; an image processing circuit to process an output signal of the solid-state image sensor; and a drive device to relatively move the solid-state image sensor at a speed in the sub-scanning direction, relative to an object.

Numerous additional modifications and variations are possible in light of the above teachings. It is therefore to be understood that within the scope of the appended claims, the embodiments may be practiced otherwise than as specifically described herein. For example, elements and/or features of different illustrative embodiments may be combined with each other and/or substituted for each other within the scope of this disclosure and appended claims.

What is claimed is:

1. A solid-state image sensor comprising:

a pixel array including a plurality of pixel sub-arrays arranged in a main scanning direction, each of the pixel sub-arrays having a plurality of pixels that are two-dimensionally arranged to form a plurality of rows along the main scanning direction and a plurality of columns along a sub-scanning direction, each of the plurality of pixels to generate a pixel signal according to light being input;

a plurality of control lines connected with respective ones of the plurality of pixel sub-arrays such that one of the plurality of control lines is connected with all pixels of at least one of the plurality of rows in each of the plurality of pixel sub-arrays;

a plurality of signal lines individually connected with all pixels in each of the plurality of pixel sub-arrays;

a pixel control circuit to apply a control signal to each pixel of each of the plurality of pixel sub-arrays through each of the plurality of signal lines, so as to cause each pixel to generate a pixel signal having a phase difference between the plurality of pixel sub-arrays; and a readout circuit to read the pixel signal from each pixel of each of the plurality of pixel sub-arrays such that the pixel signal has a phase difference between the plurality of pixel sub-arrays.

2. The solid-state image sensor according to claim 1, wherein each of the plurality of control lines is connected with all pixels of one row in each of the plurality of pixel sub-arrays.

3. The solid-state image sensor according to claim 1, wherein each of the plurality of control lines is connected with all pixels of each row in each of the plurality of pixel sub-arrays.

4. The solid-state image sensor according to claim 1, wherein the pixel array, the pixel control circuit, and the readout circuit are arranged in the sub-scanning direction, and wherein each of the plurality of control lines and the plurality of signal lines is disposed along the sub-scanning direction.

5. The solid-state image sensor according to claim 4, wherein the pixel control circuit includes a first pixel control circuit and a second pixel control circuit, each being disposed on an opposite side of the pixel array, wherein the readout circuit includes a first readout circuit and a second readout circuit, each being disposed on an opposite side of the pixel array, and wherein each of the plurality of pixel sub-arrays is connected with one of the first pixel control circuit and the second pixel control circuit, and with one of the first readout circuit and the second readout circuit.

6. The solid-state image sensor according to claim 4, wherein, in each of the plurality of pixel sub-arrays, each of the plurality of control lines is disposed along pixels of a column other than columns at both ends of the plurality of columns.

7. The solid-state image sensor according to claim 1, wherein each pixel includes:

a photoelectric conversion element to convert the light being input to a charge;

a floating diffusion;

a transfer transistor to transfer the charge from the photoelectric conversion element to the floating diffusion;

a reset transistor to reset a potential of the floating diffusion; and an amplifier transistor to amplify a voltage in the floating diffusion to generate the pixel signal, wherein, in each of the plurality of pixel sub-arrays, the plurality of control lines includes:

at least one first control line connected with the transfer transistor of each pixel; and at least one second control line connected with the reset transistor of each pixel.

8. The solid-state image sensor according to claim 1, further comprising a plurality of shielded conductors, each being provided between the plurality of pixel sub-arrays.

9. The solid-state image sensor according to claim 1, wherein the readout circuit reads the pixel signal from each pixel of each of the plurality of pixel sub-arrays through each of the plurality of signal lines, at a timing different from a rising timing and a falling timing of a signal of each of the control lines.

10. An imaging apparatus comprising:

the solid-state image sensor according to claim 1;

an optical system to guide light being input to the imaging apparatus, to each pixel of the solid-state image sensor;

an image processing circuit to process an output signal of the solid-state image sensor; and a drive device to move the solid-state image sensor at a predetermined speed in the sub-scanning direction, relative to an object.

* * * * *